United States Patent [19]

Rinderle

[11] Patent Number: 4,604,586
[45] Date of Patent: Aug. 5, 1986

[54] AMPLIFIER WITH CURRENT MIRROR CIRCUIT FOR CONTROLLING AMPLIFICATION TEMPERATURE DEPENDENCY

[75] Inventor: Heinz Rinderle, Heilbronn, Fed. Rep. of Germany

[73] Assignee: Telefunken Electronic GmbH, Heilbronn, Fed. Rep. of Germany

[21] Appl. No.: 637,033

[22] Filed: Aug. 2, 1984

[30] Foreign Application Priority Data

Aug. 17, 1983 [DE] Fed. Rep. of Germany ....... 3329665

[51] Int. Cl.$^4$ ............................................. H03G 3/10
[52] U.S. Cl. ................... 330/288; 330/289; 330/257; 330/256; 330/279
[58] Field of Search ............... 330/256, 257, 278, 279, 330/288, 289, 254

[56] References Cited

U.S. PATENT DOCUMENTS

| | | | |
|---|---|---|---|
| 3,896,394 | 7/1975 | Baro | 330/289 |
| 4,238,738 | 12/1980 | Komori | 330/289 X |
| 4,413,235 | 11/1983 | Jason | 330/289 X |

FOREIGN PATENT DOCUMENTS

| | | |
|---|---|---|
| 2308835 | 2/1973 | Fed. Rep. of Germany . |
| 2546844 | 5/1976 | Fed. Rep. of Germany . |
| 2707870 | 8/1978 | Fed. Rep. of Germany . |
| 3041591 | 9/1982 | Fed. Rep. of Germany . |
| 110726 | 1/1975 | German Democratic Rep. . |

OTHER PUBLICATIONS

McDaniel, Jim, "HP-67/97 Program Performs Current-Mirror Analysis", *Electronics*, 12/7/78, pp. 152-153.
Kröbel, Hans-Eberhard, "Grundschaltungen der Analogen Integrierten Technik", *Radio Fernsehen Elektronik*, v. 27 (1978) pp. 621-625.

*Primary Examiner*—Eugene R. LaRoche
*Assistant Examiner*—Steven J. Mottola
*Attorney, Agent, or Firm*—Spencer & Frank

[57] ABSTRACT

In a circuit arrangement for the amplification of electric signals comprising an electronic amplification control there is provided for the amplification control a current mirror circuit by means of which the temperature dependency of the amplification is adjustable.

23 Claims, 20 Drawing Figures

AMPLIFIER WITH CURRENT MIRROR CIRCUIT FOR CONTROLLING AMPLIFICATION TEMPERATURE DEPENDENCY

BACKGROUND OF THE INVENTION

Amplifiers controlled electronically via transistors harbour the problem of the amplification being temperature-dependent. In addition, the degree of the temperature dependency is dependent on the amplification setting. This effect makes the temperature compensation even more difficult.

SUMMARY OF THE INVENTION

The object underlying the invention is to provide a circuit arrangement for the amplification of electric signals whose temperature dependency is settable and whose amplification may also be made temperature-independent.

According to the invention there is provided in a circuit arrangement for the amplification of electric signals, which arrangement includes an amplification control, a current mirror circuit for the amplification control, wherein the temperature dependency of the amplification is adjustable by the current mirror circuit.

In accordance with a further development of the invention, there is arranged between the current mirror circuit and the amplifier a direct-current signal transformer which causes the amplification to be exponentially dependent on the input current of the current mirror circuit.

BRIEF DESCRIPTION OF THE DRAWINGS

The invention will now be described in greater detail, by way of examples, with reference to the drawings, in which.

DESCRIPTION OF THE PREFERRED EMBODIMENTS

Figure 1:
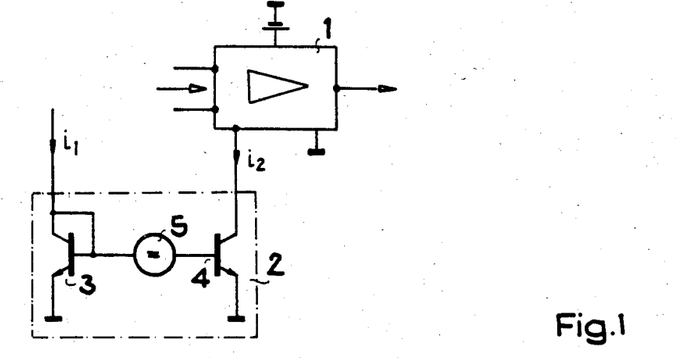
FIG. 1 shows a circuit arrangement with an amplifier.

FIG. 1 shows a circuit arrangement according to the invention comprising an amplifier 1 whose amplification is controlled by the current mirror circuit 2. A characteristic of the amplifier 1 is that its operating point is adjustable from outside (for example, by appropriate supply of current or voltage) and that its amplification is dependent on the operating point. The task of the current mirror circuit 2 is to set the operating point of the amplifier 1 so as to create a certain temperature dependency of the amplification. This also includes the case where the amplification is temperature-independent.

The amplifier 1 is appropriately controlled by the current mirror circuit 2 being of such design that the base-emitter voltages of the current mirror transistors 3 and 4 are differently dimensioned, more particularly, such that the output current $i_2$ acquires such a temperature dependency that the amplifier 1 controlled by the output current $i_2$ has the desired temperature dependency. A precondition is that the difference between the base-emitter voltages of the current mirror transistors 3 and 4 be substantially constant and consequently as independent as possible of the input current $i_1$ of the current mirror circuit 2. The required voltage difference is symbolized by the voltage source 5. The voltage source may be in the form of a real voltage source, a current source with resistor or a voltage source with voltage divider.

Figure 2:
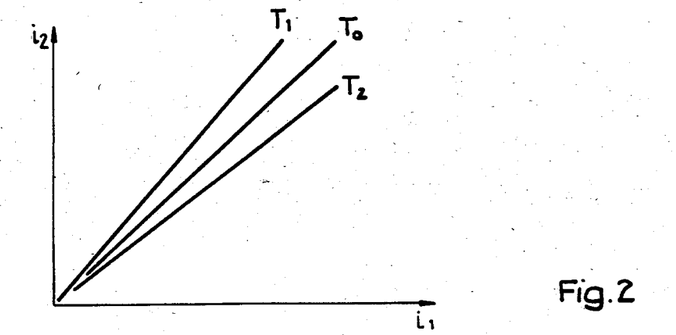
FIG. 2 shows the dependency of the output current on the input current.

FIG. 2 shows the dependency of the output current $i_2$ on the input current $i_1$ with the temperature as parameter. In the embodiment of FIG. 2, $T_o$ is reference temperature. In FIG. 2, $T_1$ is larger than the reference temperature $T_o$, whereas the temperature $T_2$ is smaller than the reference temperature $T_o$. The characteristic lines in FIG. 2 are obtained on the condition that the base-emitter voltage of the current mirror transistor 4 is smaller than that of the current mirror transistor 3. This is attained by the size and direction of the voltage of the voltage source 5. The temperature dependency of the output current $i_2$ runs in the opposite direction when the polarity of the voltage source 5 is reversed.

Figure 3:
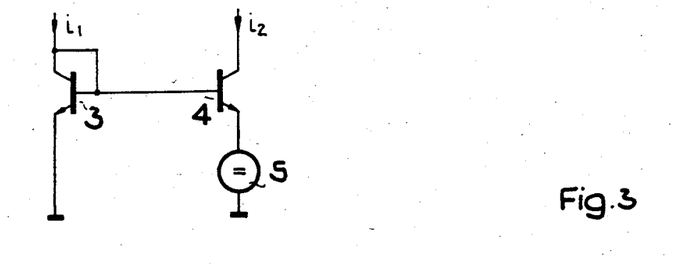
FIG. 3 shows an embodiment with a current mirror circuit.

FIG. 3 shows an embodiment of the current mirror circuit according to the invention with the transistors 3 and 4, wherein a voltage source 5 is connected between the emitter of the transistor 4 and the reference point (ground). The voltage source 5 provides the voltage difference required in accordance with the invention between the base-emitter sections of the two transistors 3 and 4. The voltage source 5 could, of course, also be inserted into the emitter section of the other transistor 3.

Figure 4:
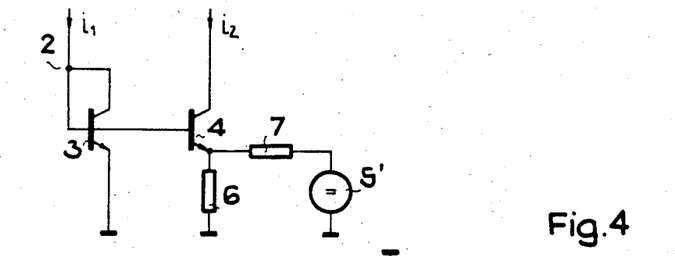
FIG. 4 shows the generation of the voltage difference between the base-emitter sections of the transistors.

While FIG. 3 shows only symbolically the generation of the required voltage difference, FIG. 4 shows how the required voltage difference is generated, for example, in practical application. In accordance with FIG. 4, the voltage difference is generated by a voltage divider consisting of the resistors 6 and 7. The voltage divider is supplied by the voltage source 5' in accordance with FIG. 4. The voltage divider ratio and the size of the voltage of the voltage source are to be selected so as to produce such a voltage difference between the two emitters of the transistors 3 and 4 that a certain temperature variation is obtained for the circuit. In order to keep down the influence of the emitter current of the transistor 4 on the voltage difference, the resistance value of the parallel connection comprising resistors 6 and 7 is to be selected correspondingly low.

If a current mirror circuit directly actuates an amplifier, the operating point of the amplifier 1 changes proportionally to the input current $i_1$ of the current mirror circuit 2. This means that the amplification of the amplifier 1 changes proportionally to the input current $i_1$ of the current mirror circuit, but only on the condition that the amplifier comprises an amplifier stage whose degree of amplification changes proportionally with the direct-current with which it is supplied. This condition is met, for example, in a non-countercoupled differential amplifier.

Figure 5:
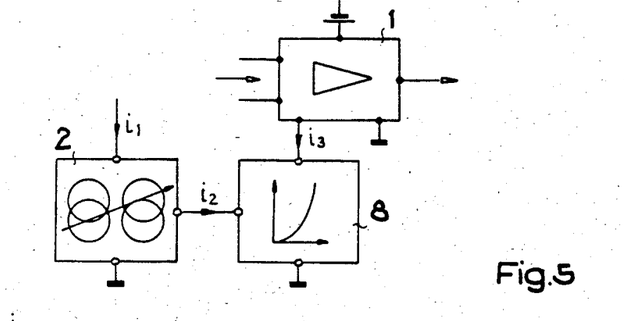
FIG. 5 shows a direct-current signal transformer between the current mirror circuit and the amplifier.

In the arrangement of FIG. 5 there is connected between the current mirror circuit 2 and the amplifier 1 a direct-current signal transformer 8 whose task it is to perform the output direct-current of the current mirror circuit 2 into an exponential current dependent on this current. By interposition of the direct-current signal transformer 8 there is obtained at the output of the amplifier 1 a signal which depends exponentially on the input signal $i_1$ of the current mirror circuit.

Figure 6:
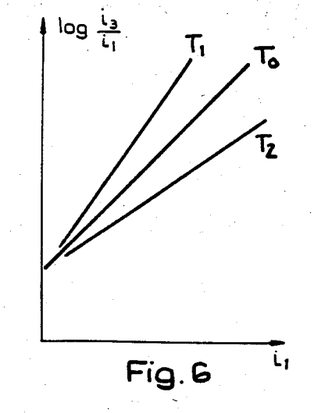
FIG. 6 shows the current relationship $i_3/i_1$ in dependence upon $i_1$.
Figure 7:
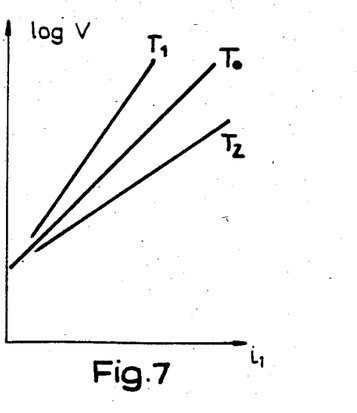
FIG. 7 shows the course of the amplification in dependence upon the control current.

FIG. 6 shows on a half-logarithmic scale the current relationship $i_3/i_1$ in dependence upon $i_1$ (when a direct-current signal transformer 8 is interposed). The temperature variation of the current relationship $i_3/i_1$ is dependent on the current mirror circuit 2, more particularly, on the difference between the voltages at the base-emitter sections of the transistors 3 and 4. FIG. 7 shows the corresponding course of the amplification V of the amplifier 1 in dependence upon the control current $i_1$. In FIGS. 6 and 7, the temperatures $T_o$, $T_1$ and $T_2$ are parameters.

FIGS. 8 to 12 are embodiments for the direct-current signal transformer 8. The embodiment of FIG. 8 comprises an inverting circuit and the embodiment of FIG. 9 a non-inverting circuit. The inverting circuit of FIG. 8 consists of the transistors 9 and 10, a current source 11 and a resistor 12. The transistor 13 effects the exponential dependency of the current $i_3$ on the current $i_2$ in accordance with the known characteristic curve law of transistors.

The transistors 9 and 10 in conjunction with the size of the current of the current source 11 determine the quiescent operating point of the transistor 13 without control, i.e., $i_2=0$. From a current change of $i_2$, the circuit of FIG. 8 makes a corresponding voltage change at resistor 12. There is thereby obtained at the output of transistor 13 a current which is exponentially dependent on the input current $i_2$. The voltage source 14 supplies the operating voltage for the circuit.

Figure 8:
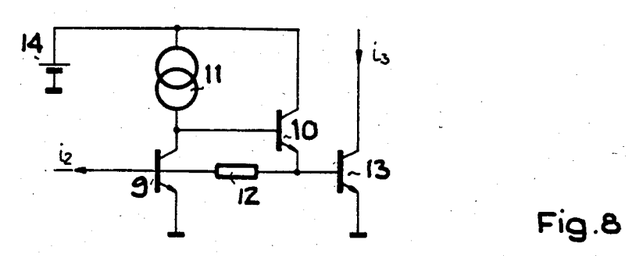
FIG. 8 shows an inverting circuit as direct-current signal transformer.
Figure 9:
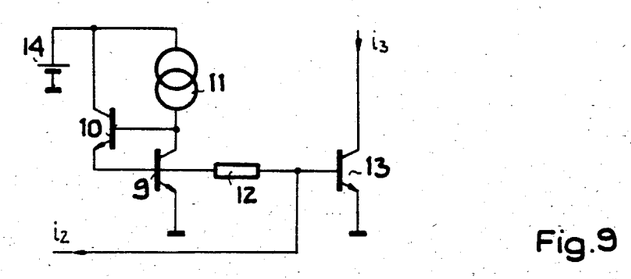
FIG. 9 shows a non-inverting circuit as direct-current signal transformer.

The circuit of FIG. 9 differs from the circuit of FIG. 8 in that the current $i_2$ is not fed to the base of the transistor 9 but to the base of the transistor 13. The control effect is thereby turned around, i.e., while in the circuit of FIG. 8 the current $i_3$ increases with the current $i_2$, the current $i_3$ in the circuit of FIG. 9 decreases as the current $i_2$ increases.

Figure 10A:
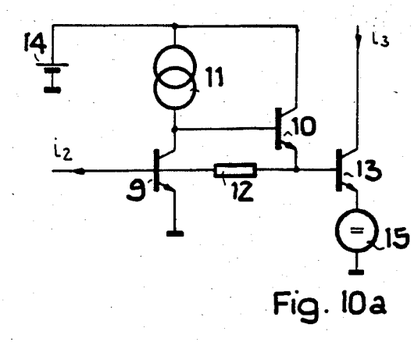
FIG. 10a shows temperature influencing by an additional voltage source.
Figure 10B:
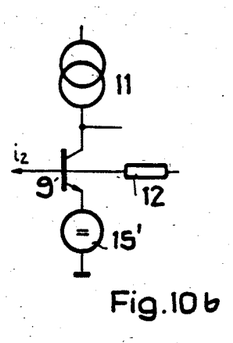
FIG. 10b shows a different embodiment of the additional voltage source.

The circuit of FIG. 10a differs from the circuit of FIG. 8 in that there is provided in addition a voltage source 15 which can additionally influence the temperature variation of the current $i_3$. In the circuit of FIG. 10b, the voltage source 15' is not inserted in the emitter lead of the transistor 13, but in the emitter lead of the transistor 9.

Figure 11A:
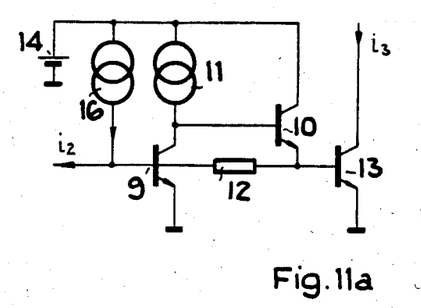
FIG. 11a shows temperature influencing by a current source.
Figure 11B:
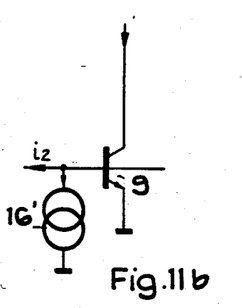
FIG. 11b shows a different arrangement of the current source.

In the arrangements of FIGS. 11a and 11b, temperature influencing is not effected by a voltage source, but by a current source 16, 16' which is connected in such a way that in the arrangement of FIG. 11a it supplies the base point of the transistor 9 with a current and in the arrangement of FIG. 11b takes away a current.

Figure 11C:
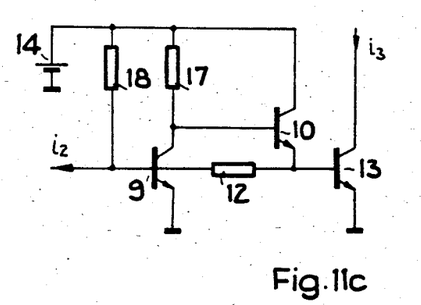
FIG. 11c shows resistors instead of current sources.

In the circuit of FIG. 11c, the current sources 11 and 16 are replaced by resistors 17, 18. The resistors have the same purpose as the current sources in the circuit of FIG. 11a.

Figure 12:
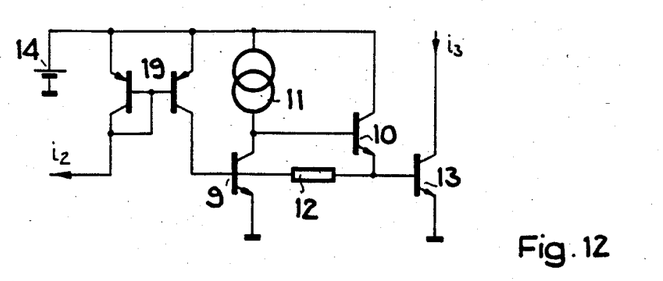
FIG. 12 shows the feeding of the input current via a current mirror circuit.
Figure 13:
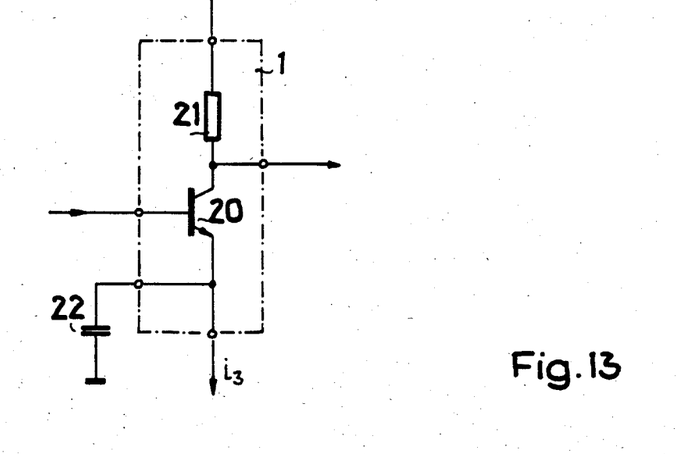
FIG. 13 shows an amplifier consisting of a transistor, a collector resistor and a blocking capacitor.

In the circuit of FIG. 12, the input current $i_2$ is supplied to the base of the transistor 9 via a current mirror circuit 19. The current mirror turns around the control effect of the input current $i_2$ in relation to $i_3$.

Figure 14:
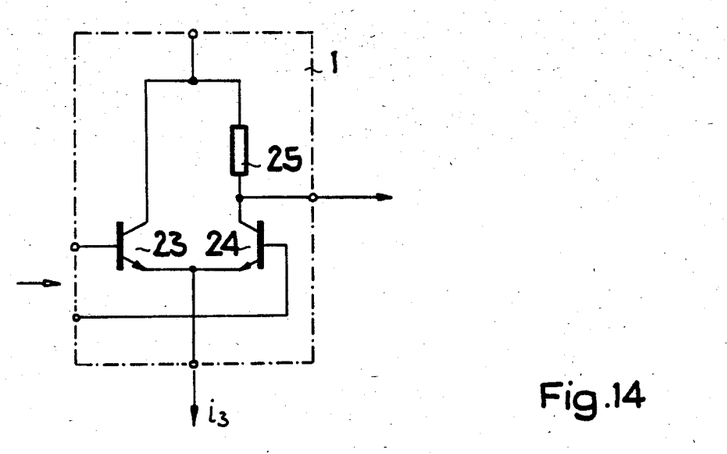
FIG. 14 shows an amplifier consisting of a differential amplifier.

FIGS. 13 to 16 show embodiments of the amplifier 1. The amplifier of FIG. 13 consists of the transistor 20, the collector resistor 21 and the blocking capacitor 22. The amplifier of FIG. 14 is a differential amplifier with the transistors 23 and 24 and the collector resistor 25.

Figure 15:
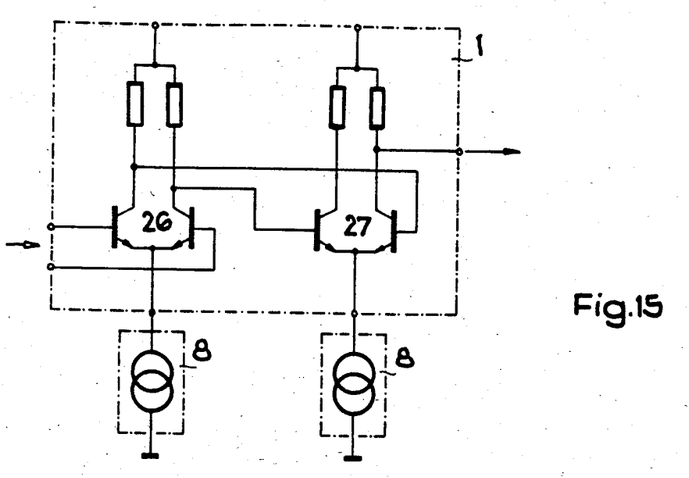
FIG. 15 shows two differential amplifiers in cascade connection.

The amplifier 1 of FIG. 15 comprises two differential amplifiers 25 and 27 in cascade connection, at least one of which is current-controlled. The current control is effected by direct-current signal transformers 8, as apparent, for example, from FIG. 5.

Figure 16:
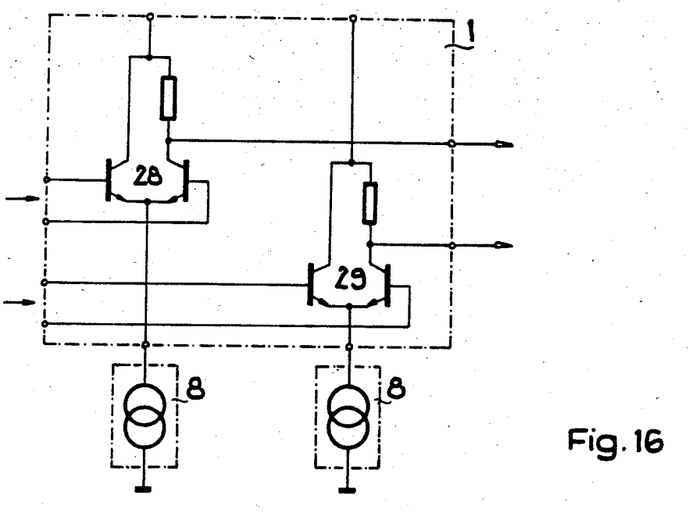
FIG. 16 shows two separate amplifier stages.

The amplifier 1 of FIG. 16 comprises two separate amplifier stages which have separate inputs and separate outputs and which are both current-controlled (by direct-current signal transformers 8).

Figure 17:
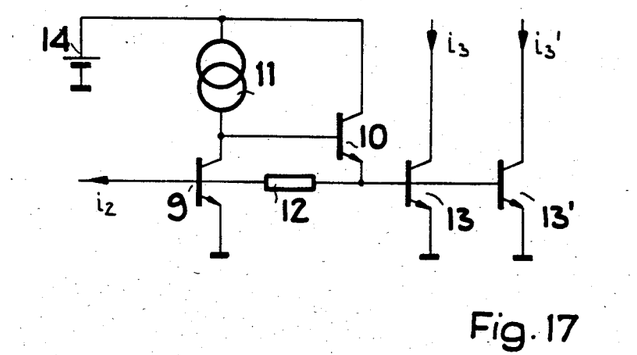
FIG. 17 shows a direct-current signal transformer.

FIG. 17 shows a direct-current signal transformer which supplies two or more output currents $i_3$, $i_{3'}$ by means of two or several transistors 13, 13' whose emitter-base sections are connected in parallel. This circuit enables the simultaneous control of several amplifier stages with one single control signal $i_1$.

What is claimed is:

1. In a circuit arrangement for controlling an amplifier which effects amplification of electric signals, the amplifier having a current controllable amplification, the circuit arrangement comprising an electronic amplification control, wherein there is provided for the amplification control a current mirror circuit by means of which the temperature dependency of the amplification is adjustable, the improvement wherein said current mirror circuit comprises:

first and second transistors;

input means connected for supplying to said first transistor an input current for controlling the amplification of the amplifier;

output means connected to said second transistor for providing an output current derived from the input current;

current supply means connected to said output means for causing the amplification to be adjusted as a function of the value of the output current; and voltage supply means connected to at least one of said transistors for causing the base-emitter voltage of said first transistor to differ from the base-emitter voltage of said second transistor by a selected amount which is substantially independent of the input current value and which creates a selected temperature-dependent relation between the input current and the output current so that the amplification is controlled by the input current.

2. A circuit arrangement according to claim 1, wherein the temperature relation between the input current and the output current of the current mirror circuit is adjustable.

3. A circuit arrangement according to claim 1, wherein the size and the direction of the base-emitter voltage difference determine the temperature dependency of the amplification.

4. A circuit arrangement according to claim 1, wherein said voltage supply means comprise a current source and a resistor.

5. A circuit arrangement according to claim 4, wherein the resistor is connected between the bases of the current mirror transistors.

6. A circuit arrangement according to claim 5, wherein the current source is connected parallel to the resistor.

7. A circuit arrangement according to claim 1, wherein said voltage supply means comprise a voltage divider fed by a direct-current voltage source.

8. A circuit arrangement according to claim 7, wherein said voltage divider comprises two resistors connected together at a point of connection which is connected to the emitter of one said transistor, and the end of one of said resistors facing away from the connection point has the same potential as the emitter of the other said transistor.

9. A circuit arrangement according to claim 1, wherein the amplification occurs with respect to an operating point and changes in dependence upon the current which is fed by said current supply means for the setting of the operating point.

10. A circuit arrangement according to claim 1, wherein said signal transformer is in the form of an inverter.

11. A circuit arrangement according to claim 1, wherein the temperature dependency of the output current of the current mirror circuit is so designed that the temperature dependency of the inclination of the control characteristic line between amplification degree and input current of the current mirror circuit is compensated.

12. A circuit arrangement according to claim 1, wherein the direct-current signal transformer comprises two transistors between whose bases there is connected a resistor through which the output current of the current mirror circuit flows.

13. A circuit arrangement according to claim 12, wherein a constant direct-current voltage which influences the temperature variation of the current supplied by the direct-current signal transformer is fed to the emitter of one of the two transistors between whose bases the resistor is connected.

14. A circuit arrangement according to claim 12, wherein a current source whose current is added to the output current of the current mirror circuit is provided, and the temperature variation of the current supplied by the direct-current signal transformer is thereby influenced.

15. A circuit arrangement according to claim 12, wherein there is provided a resistor which as a result of a potential difference located at it supplies a current which is added to the output current of the current mirror circuit and thereby influences the temperature variation of the current supplied by the direct-current signal transformer.

16. A circuit arrangement according to claim 1, wherein a further current mirror circuit which reverses the control effect exerted by the output current of the first current mirror circuit is connected between the first current mirror circuit and the direct-current signal transformer.

17. A circuit arrangement according to claim 1 wherein the amplifier comprises a transistor with a collector resistor and also a blocking capacitor.

18. A circuit arrangement according to claim 1 wherein the amplifier comprises a differential amplifier with transistors and also a collector resistor.

19. A circuit arrangement according to claim 1 wherein the amplifier comprises at least two differential amplifiers in cascade connection, and said current supply means comprise one direct-current signal transformer actuating each of said differential amplifiers.

20. A circuit arrangement according to claim 1 wherein the amplifier circuit comprises two separate amplifiers and said current supply means comprise one direct-current signal transformer actuating each of said separate amplifiers.

21. A circuit arrangement according to claim 1, wherein said current supply means comprise a direct-current signal transformer having at least two transistors whose emitter-base sections are connected in parallel for supplying at least two output currents.

22. A circuit arrangement according to claim 1 wherein the amplifier operates with an associated operating point, and wherein said current supply means are connected to said amplifier for supplying the output current of said mirror circuit to said amplifier for setting the operating point.

23. A circuit arrangement according to claim 1 wherein said current supply means comprises a direct current signal transformer for supplying to the amplifier an amplification controlling current which varies exponentially with the input current to said mirror circuit.

* * * * *